United States Patent [19]
Bäckström et al.

[11] Patent Number: 5,191,598
[45] Date of Patent: Mar. 2, 1993

[54] SYSTEM FOR REDUCING THE AFFECTS OF SIGNAL FADING ON RECEIVED SIGNALS

[75] Inventors: Tomas O. Bäckström, Kista; Ragnar E. Kahre, Kävlinge; Jan-Erik Stjernvall, Sollentuna, all of Sweden

[73] Assignee: Telefonaktiebolaget L M Ericsson, Stockholm, Sweden

[21] Appl. No.: 652,419

[22] Filed: Feb. 7, 1991

[30] Foreign Application Priority Data

Feb. 16, 1990 [SE] Sweden ............................... 9000566

[51] Int. Cl.$^5$ .......................... H04B 7/02; H04L 1/02
[52] U.S. Cl. ..................................... 375/100; 375/40; 375/94; 375/101; 455/137; 455/273
[58] Field of Search ................. 375/14, 38, 39, 40, 375/94, 100, 101; 371/43, 45; 455/137, 138, 273

[56] References Cited

U.S. PATENT DOCUMENTS

| | | | |
|---|---|---|---|
| 3,633,107 | 1/1972 | Brady | 375/40 |
| 4,283,788 | 8/1981 | Tamburelli | 375/14 |
| 4,733,402 | 3/1988 | Monsen | 375/100 |
| 4,847,871 | 7/1989 | Matsushita et al. | 375/94 |
| 4,881,241 | 11/1989 | Pommier et al. | 371/43 |
| 5,029,186 | 7/1991 | Maseng et al. | 375/101 |
| 5,031,193 | 7/1991 | Atkinson et al. | 375/100 |

FOREIGN PATENT DOCUMENTS

0332290A2 2/1989 European Pat. Off. .

OTHER PUBLICATIONS

Combined Space/Time Diversity Technique for Narrowband TDMA Mobile Radio Systems, L. B. Lopes, Electronic Letters, vol. 25, No. 15, Jul. 20, 1989, pp. 1001–1002.

Mobile Communications Design Fundamentals, William C. Y. Lee, Howard W. Sams & Co., Chapter 1 and Section 3.5.1, Indiana, U.S.A. (1986).

Adaptive Maximum-Likelihood Sequence Estimation for Digital Signals in the Presence of Intersymbol Interference, F. R. Magee, Jr. & J. G. Proakis, IEEE Trans. on Info. Theory–Jan. 1973, pp. 120–124.

The Viterbi Algorithm, G. David Forney, Jr., Proceedings of the IEEE, vol. 61, No. 3, Mar. 1973, pp. 268–278.

Self-Recovering Equalization in Carrier Tracking in Two-Dimensional Data Communication Systems, D. N. Codard, IEEE Transactions on Communications, vol. COM-28, No. 11, Nov. 1980, pp. 1867–1875.

Primary Examiner—Curtis Kuntz
Assistant Examiner—Young Tse
Attorney, Agent, or Firm—Burns, Doane, Swecker & Mathis

[57] ABSTRACT

Signals in synchronizing sequences and data sequences are transmitted over a fading channel to a Viterbi-receiver. The signals are received by antennas and sampled to received antenna signals ($s_{in,r}(k)$). Part channel estimates ($h_{est,r}$) for the individual antennas are formed. For Viterbi-analysis, assumed input signals ($s_{a,r}(\Delta T_{ij},k)$) for the data sequence are produced with the aid of the part channel estimates ($h_{est,r}$). Part metric values ($m_r(\Delta T_{ij}, k)$) are formed as a difference between the received antenna signal ($s_{in,r}(k)$) and corresponding assumed input signals ($s_{a,r}(\Delta T_{ij}, k)$) for Viterbi state transitions ($\Delta T_{ij}$). For one state transition there is formed a metric value such as the sum of a metric value (($M(T_j, k-1)$)) for an old state ($T_j$) at a preceding sampling time point ($k-1$) increased with a weighted ($K_r$) sum of the part metric values ($m_r(\Delta T_{ij}, k)$) belonging to individual part channel estimates ($h_{est,r}$). Corresponding metric values are formed for all state transitions to the new state ($T_i$) and the smallest of these metric values is chosen in accordance with the Viterbi-algorithm.

10 Claims, 4 Drawing Sheets

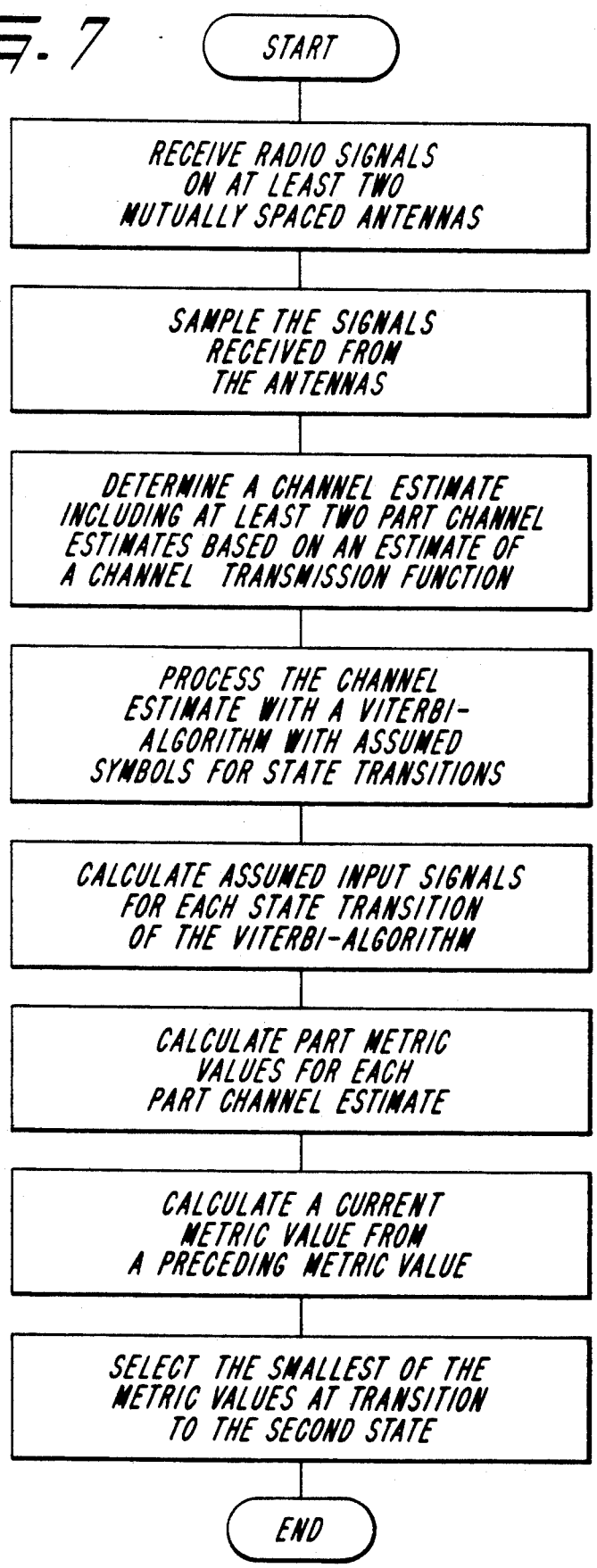

SYSTEM FOR REDUCING THE AFFECTS OF SIGNAL FADING ON RECEIVED SIGNALS

FIELD OF THE INVENTION

The present invention relates to a system for reducing the influence of fading of a Viterbi-receiver having at least two antennas.

BACKGROUND OF THE INVENTION

A common problem that occurs in radio transmission of signals is that the signals are lost as a result of interference and fading. This problem is evident in mobile radio transmissions in which a mobile receiver moves in an interference field with frequently recurring fading. The receiver receives radio signals over a channel which is liable to disturbance. The signals are received on the antennas, which are mutually spaced apart, and sampled. A channel estimate is formed, and signal processing in an equalizer of the Viterbi-receiver in accordance with the Viterbi-algorithm. One known method of reducing the influence of fading is to use a receiver which has two or more mutually spaced antennas, for instance as described in Electronics Letters, Jul. 20, 1989, Vol. 25, No. 15, L. B. Lopes: Combined Space/Time Diversity Technique for Narrowband TDMA Mobile Radio Systems. A transmitted digital radio signal is received by a first antenna and is delayed in time by a suitable selected time interval. The radio signal is also received by a second antenna whose signal is added to the delayed signal and the summation signal is processed in an equalizer, which may be a Viterbi-equalizer. The article discloses that the bit error content decreases in accordance with the length of the delay interval. An alternative method is one of using receivers that are equipped with several antennas, as described in Mobile Communications Design Fundamentals by William C. Y. Lee, Howard W. Sams & Co, Indiana, USA. In section 3.5.1 of this book several examples are given as to how signals from two receiver amplifiers with separate antennas can be added in order to counteract fading. In the case of digital signal transmission this addition results in the difficulty of necessitating phase correct addition of the signals. The signals received by the individual antennas may be in counter-phase and extinguish one another, even when the signals received by the antennas have a satisfactorily high strength. Consequently, it is necessary to phase-lock the signals, which is difficult to achieve, particularly with a rapidly fading channel which is subjected to noise disturbances. Slow, variable phase-locking is used advantageously in the case of such noise disturbances, whereas the rapid fading requires rapid, variable phase locking.

SUMMARY OF THE INVENTION

The aforementioned problems of processing in a receiver signals which are obtained from mutually separate antennas in order to reduce to effect of fading is solved in accordance with the present invention. There is estimated for each antenna a transmission function for the channel corresponding to the antenna. There is calculated for each state transition between an old and a new state in the Viterbi-algorithm a part metric value for each antenna signal, with the aid of respective channel estimates. The part metric values for individual antenna signals are mutually weighted and used to calculate the metric values at the transition between the old and the new state.

BRIEF DESCRIPTION OF THE DRAWINGS

An exemplifying embodiment of the invention will now be described in more detail with reference to the accompanying drawings, in which.

DETAILED DESCRIPTION OF THE PREFERRED EMBODIMENTS

Figure 1:
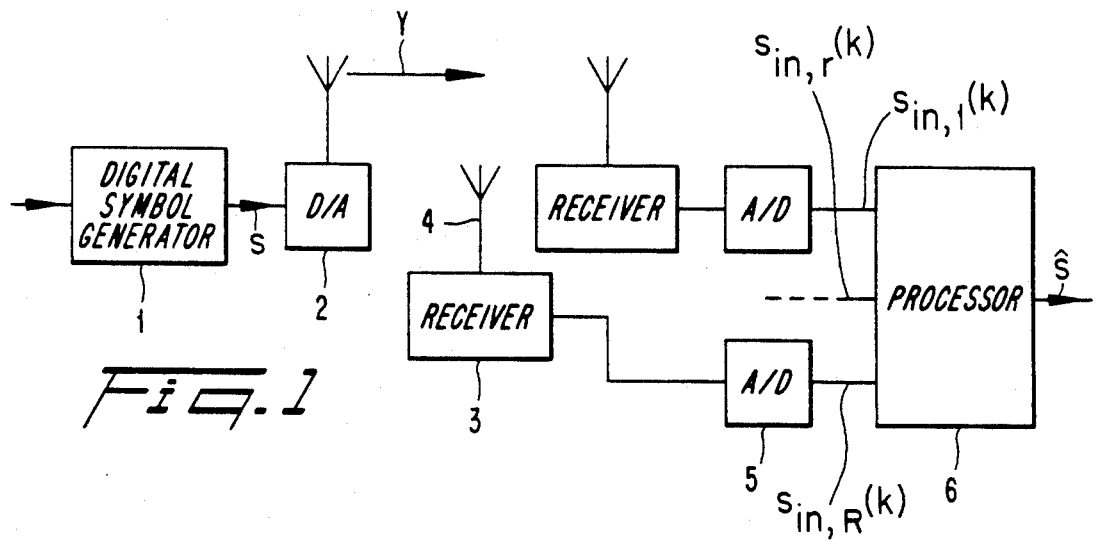
FIG. 1 illustrates schematically a radio transmission system comprising a transmitter, a receiver and an intermediate disturbed channel.

A radio transmission system for time shared radio communication is illustrated schematically in FIG. 1. A transmitter has a unit 1 which receives an information carrying signal and generates corresponding digital symbols s. These symbols are subjected to digital-/analogue conversion and modulation and are transmitted as an analogue signal Y from a unit 2, in accordance with known techniques. The signal Y is intercepted by a receiver having receiving units 3 which are R in number. Each of the receiving units has an antenna 4 and is connected to a respective analogue/digital converter 5. These converters convert the signals received from the antennas 4 to received antenna signals $s_{in,r}(k)$ The reference k identifies a sampling time point with number k, while reference r indicates that the signal arrives from the r:th antenna, $1 \leq r \leq R$. The received antenna signals $s_{in,r}(k)$ are sent to a unit 6 in which signals are processed in accordance with the inventive method. The processor unit 6 includes means which carry out the Viterbi-algorithm and means for estimating a channel transmission function. The processor unit 6 produces estimated symbols $\hat{s}$ which correspond to the digital symbols s.

The transmitted signal Y is disturbed during transmission, among other things by fading, the disturbing influence of which on the estimated symbols $\hat{s}$ is reduced in the receiver. This is achieved by the fact that the antennas 4 are at least two in number, $R \geq 2$, and in that the received antenna signals $s_{in,r}(k)$ are processed in accordance with the present invention as described in more detail herebelow.

Figure 2:
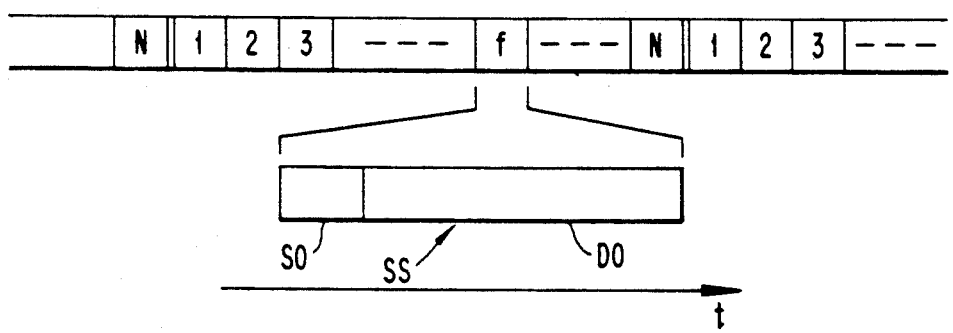
FIG. 2 illustrates time slots for a time shared transmission system, and a time slot signal sequence.
Figure 3:
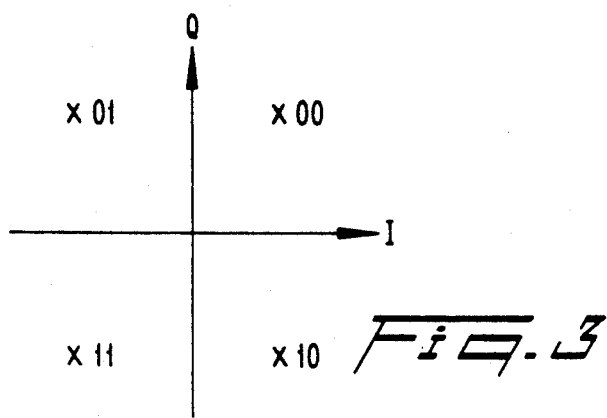
FIG. 3 is a diagram which illustrates the individual values of a transmitted symbol.

The radio transmission system according to the present embodiment is time-shared with separate time slots 1-N according to FIG. 2, in which t represents time. Each time slot f can transmit a signal sequence SS, which includes a synchronizing sequence SO and a data sequence DO containing the information to be transmitted. The signal sequence SS contains binary information, although the aforesaid symbols can be modulated in accordance with quadrature modulation for instance, as illustrated in FIG. 3. In a complex numeric plan with the axes referenced I and Q, the four possible values of the modulated symbols are marked one in each quadrant with the binary number 00, 01, 10 or 11. That time taken to transmit one such modulated symbol is designated symbol time TS.

Figure 4:
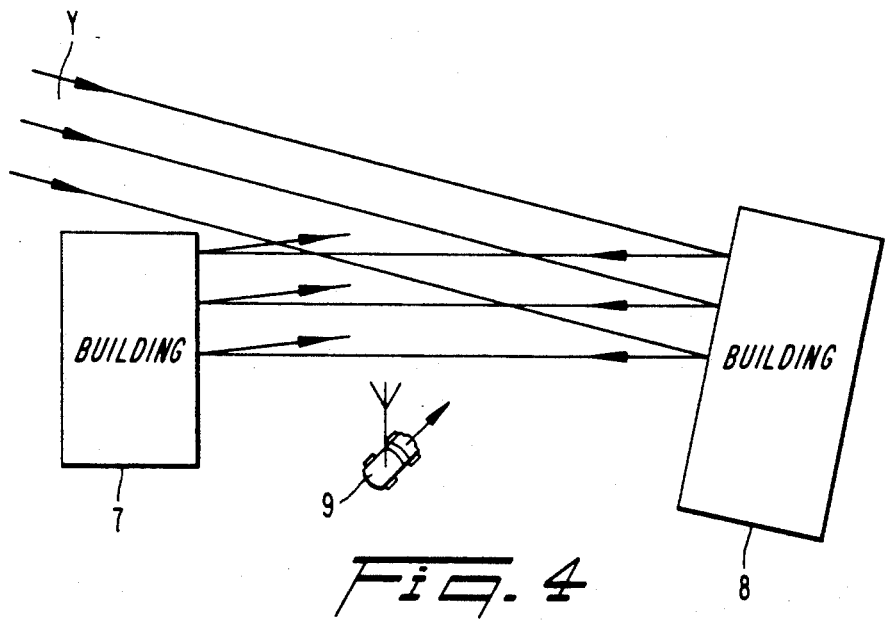
FIG. 4 illustrates a mobile receiver which moves in a signal interference pattern between two buildings.

The aforesaid signal fading, so-called Rayleigh-fading, occurs in the following manner. FIG. 4 illustrates two buildings 7 and 8 which reflect the transmitted signal Y. The reflected signals interfere with one another between the buildings and, as a result of a phase shift, there may occur a regular interference pattern with alternating bulges and nodes of the signal strength. A mobile receiver 9 which moves through the interference pattern will repeatedly pass the nodes where the signal strength is very low. A more exhaustive description of signal fading is given in the aforesaid reference Mobile Communications Design Fundamentals by William C. Y. Lee, Chapter 1.

Figure 5:
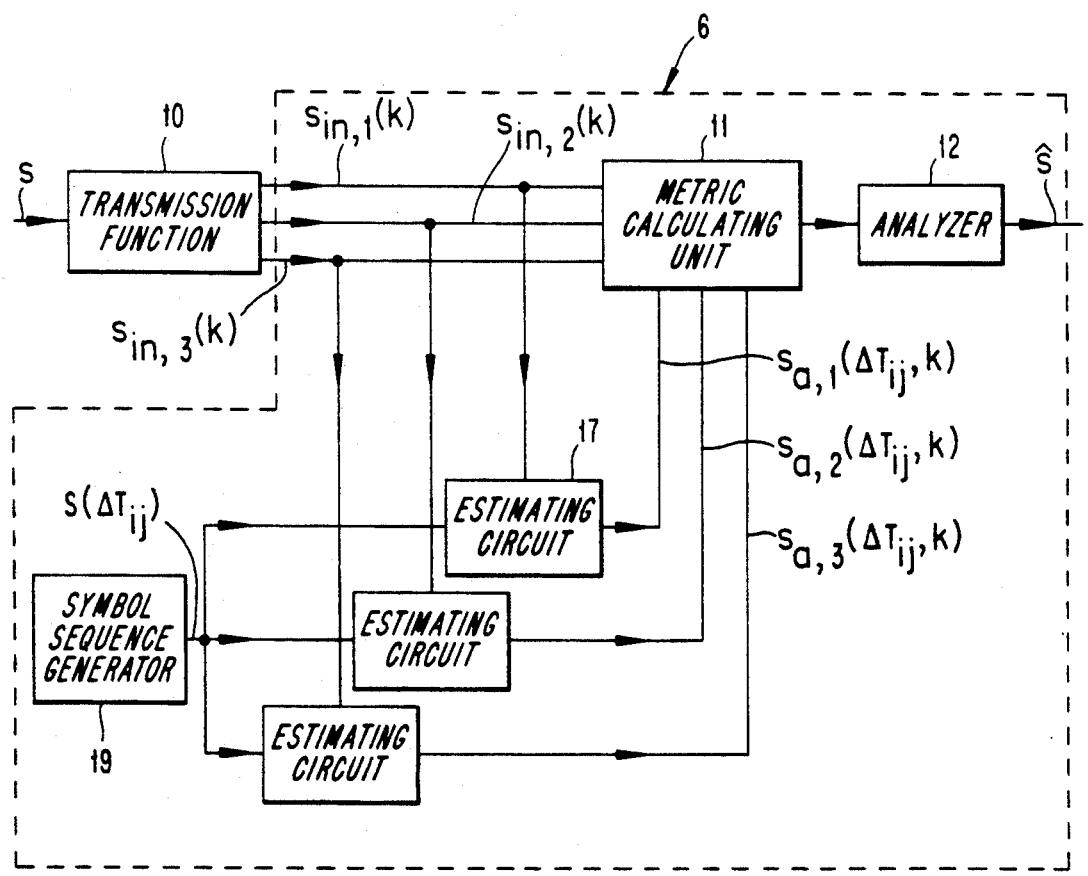
FIG. 5 is a block schematic illustrating a receiver which processes signals in accordance with the inventive method.

The processing unit 6 is illustrated in more detail in FIG. 5, where for the sake of simplicity the number of antennas R has been restricted to three. FIG. 5 also shows a block 10 which symbolizes a transmission function h for the actual transmission channel which influences the digital signal s. The transmission function h includes the transmitting units 2, the radio transmission of the signal Y, the receiving units 3 and the analogue/digital converters 5. The processor unit 6 includes a symbol sequence generator 19, channel estimating circuits 17 for the respective antennas 4, a metric calculating unit 11 and an analyzer 12 which effects signal processing in accordance with the Viterbialgorithm. A part channel estimate $h_{est,r}$ is calculated in each of the channel estimating circuits 17. Each part channel estimate is calculated in a known manner, by comparing the synchronizing sequence SO generated by the symbol sequence generator 9 with the received antenna signals $s_{in,r}(k)$ for the transmitted synchronizing sequence SO. It is assumed in the present embodiment that the part channel estimates $h_{est,r}$ are calculated once with each signal sequence SS, with the aid of the synchronizing sequence SO, and are held constant during the data sequence DO. It is possible, however, to adapt the part channel estimates $h_{est,r}$ in a known manner, for instance in the manner described in IEEE Transations on Information Theory, January 1973, F. R. Magee Jr. and J. G. Proakis: Adaptive Maximum-Likelihood Sequence Estimation for Digital Signaling in the Presence of Intersymbol Interference.

The following description of the operation of the present invention is also illustrated in FIG. 7. When the data sequence DO is transmitted, the received antenna signals $s_{in,r}(k)$ are obtained for the information to be transmitted. These signals are analyzed in accordance with the aforesaid Viterbi-algorithm, which has a number of states $M=V^{D-31\ 1}$. V designates a number of values which a symbol can assume, this value being $V=4$ in the case of the symbols shown in FIG. 3. D designates the time dispersion for the transmission channel in the number of symbol times TS and it is assumed in the illustrated embodiment that D equals 2. This means that the Viterbi-algorithm shall have $M=4$ states in which it is able to carry out the desired processing of the received antenna signals $s_{in,r}(k)$. A more detailed description of the Viterbi-algorithm is given, for instance, in Proceeding of the IEEE, Vol. 61, No. Mar. 3, 1973, G. D. Forney, Jr.: The Viterbi Algorithm. The symbol sequence generator 9 assumes sequences of symbols $S(\Delta T_{ij})$ for a state transition $\Delta T_{ij}$ in the Viterbi-algorithm from an old state $T_j$ to a new state $T_i$. With the aid of the channel estimates $h_{est,r}$, assumed input signals are calculated in accordance with a relationship $$S_{a,r}(\Delta T_{ij},k) = h_{est,r} * S(\Delta T_{ij})$$

in which the symbol * indicates a convolution. The part metric values $m_r(\Delta T_{ij},k)$ for a future selection of the state transition $\Delta T_{ij}$ is calculated with the aid of the assumed input signals $s_{a,r}(\Delta T_{ij},k)$ and the received antenna signals $s_{in,r}(k)$, as will be described with reference to FIG. 6.

Figure 6:
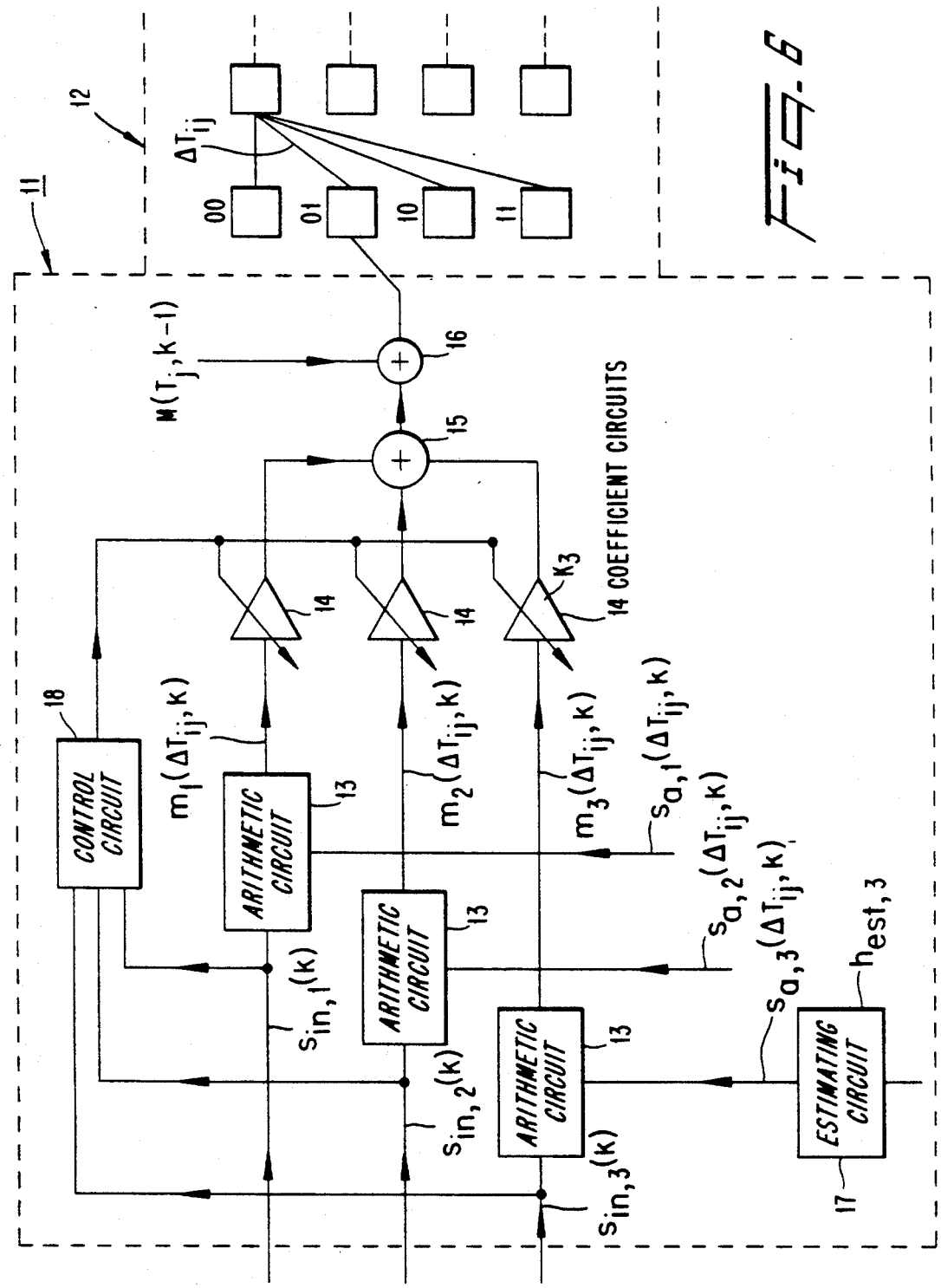
FIG. 6 is a block schematic which illustrates parts of the receiver in FIG. 5 in more detail.

FIG. 6 illustrates the Viterbi-analyzer 12 and the metric calculating unit 11. This unit includes for each of the part channel estimates $h_{est,r}$ an arithmetic circuit 13 and a coefficient circuit 14. The arithmetic circuits 13 function to calculate the part metric values in accordance with a relationship $$m_r(\Delta T_{ij},k) = |s_{in,r}(k) - s_{a,r}(\Delta T_{ij},k)|^2.$$

Similar to the aforegoing, the reference k designates an indicated sampling time, the index r designates one of the antennas, and $\Delta T_{ij}$ designates the state transitions according to the Viterbialgorithm. In the case of the preferred embodiment, this algorithm has $M=4$ states designated by binary numbers 00, 01, 10, 11, having four transitions to each new state, as illustrated in the FIG. 6, and thus a total of 16 state transitions. A metric value is calculated for each of these state transitions in accordance with a relationship $$M(\Delta T_{ij},k) = M(T_j,k-1) + \sum_{r=1}^{R} K_r \cdot m_r(\Delta T_{ij},k).$$

$K_r$ designates, in this case, the coefficients in the circuits 14 and the weighted summation is carried out in a summator 15 for all of the R antennas. In accordance with the Viterbi-algorithm, the magnitude $M(T_j,k-1)$ relates to a selected metric value for the old state $T_j$ at a sampling time point k-1 one symbol time TS prior to the indicated sampling point k. The old metric value is increased with the weighted sum of the part metric values in a summator 16. According to the Viterbi-algorithm there is selected the smallest of the metric values at the transition to the new state $T_i$, according to a relationship $$M(T_j,k) = \min_{i}\{M(\Delta T_{ij},k)\}$$

The metric value $M(T_j,k)$ is thus the value selected for the new state at the indicated sampling time point k. The metric value $M(T_j,k)$ is used in accordance with the Viterbi-algorithm, in order to determine the estimated symbols s. The metric value is also stored for continued calculation of the metric values at the subsequent sampling time point $k+1$.

The coefficients $K_r$ for weighting the part metric values can be selected in various ways. According to one simple alternative, all of the coefficients are constant and mutually equal and in the case of the example illustrated in FIG. 6 where $R=3$, $K_r$ will equal P/3 where P is a chosen constant. This method implies that the radio signal on one of the antennas 4 with fully developed fading will have the same weighting in the metric calculation as the signal on one of the antennas where the signal strength is good. According to a more complicated alternative, the strength of the received antenna signals according to $s_{in,r}(k)$ is measured by a control circuit 18 and the value of the coefficients $K_r$ are assumed by the control circuit in dependence on this signal strength. According to one advantageous embodiment, $K_r$ is proportional to the energy in respective received antenna signals $K_r = C \cdot |s_{in,r}(k)|^2$. In this case, C designates a constant which is chosen so the sum of the coefficients $\Sigma K_r$ will equal P in accordance with the aforegoing.

The invention has been described with reference to a time shared system for radio communication. It is possible, however, to apply the invention also to other systems, for instance systems for frequency shared radio communication. In such systems it is sufficient to transmit a synchronizing sequence used in forming a channel estimate once at the beginning of a message. The channel estimate is thereafter adapted during the whole of the message, with the aid of the signal transmitted unbrokenly during this time period. If there is limited demand on the speed of the system, it is also possible to form a channel estimate in the complete absence of a synchronizing sequence, for instance in the manner described in IEEE Transactions on Communications, Vol. COM-28, No. 11 November 1980, D. N. Godard: "Self-Recovering Equalization and Carrier Tracking in Two-Dimensional Data Communication System".

We claim:

1. A method for reducing the influence of signal fading in a Viterbi-receiver, comprising the steps of:
   (a) receiving radio signals on at least two mutually spaced apart antennas;
   (b) sampling signals received from said antennas;
   (c) determining a channel estimated including at least two part channel estimates corresponding respectively to said at least two antennas based on an estimate of a channel transmission function; and
   (d) processing said channel estimate in accordance with a Viterbi-algorithm wherein symbols are assumed for state transitions of said Viterbi-algorithm, said processing including:
   (e) calculating for each state transition of the Viterbi-algorithm assumed input signals based on said assumed symbols and said part channel estimates;
   (f) calculating part metric values for each part channel estimate based on said received antenna signal corresponding to said part channel estimates and said corresponding assumed input signal;
   (g) calculating for each current state transition between an old and a new state in said Viterbi-algorithm a current metric value from a preceding metric value corresponding to said old state combined with a weighted sum of said part metric values; and
   (h) selecting a smallest of said metric values at transition to said new state.

2. A method according to claim 1, wherein said calculating step (f) is based on an absolute value of a difference between said received antenna signal and said assumed input signal.

3. A method according to claim 1, wherein coefficients for weighting said part metric values have identical values which is determined by a constant divided by the number of received radio signals.

4. A method according to claim 1, wherein coefficients for weighting said part metric values depend on the amplitude of said antenna signals.

5. A method according to claim 4, wherein said coefficients for weighting said part metric values are proportional to an energy of said antenna signals.

6. A system for reducing the affects of signal fading on a receiver, comprising:
   plural, mutually spaced apart antennas, for receiving radio signals including a sequence of digital symbols over a communications channel;
   means for sampling signals generated by said antennas;
   means for generating partial estimates corresponding to and based on said antenna signals and an associated set of assumed symbols; and
   means for processing said antenna signals to generate over a number of state transitions a sequence of estimated symbols corresponding to said receiving digital symbols, said processing means including:
   means for calculating each state transition a set of postulates based on said antenna signals and said partial estimates;
   means for determining partial confidence factors corresponding to each partial estimate and said postulates;
   means for calculating each state transition between an old and a new state, a current confidence factor from a preceding confidence factor corresponding to said old state and weighted sum of said partial confidence factors; and
   means for analyzing said current confidence factors and for selecting an optimal, current confidence factor at said transition to said new state.

7. The system according to claim 6, wherein said means for determining partial confidence factors includes means for calculating an absolute value of a difference between said antenna signals and said corresponding postulates.

8. The system according to claim 6, wherein coefficients for weighting said sum of partial confidence factors have identical values based on a constant divided by the number of received radio signals.

9. The system according to claim 6, wherein coefficients for weighting said sum of partial confidence factors depends on the amplitude of said antenna signals.

10. The system according to claim 9, wherein said coefficients are proportional to an energy of said antenna signals.

* * * * *